United States Patent [19]
Jasper

[11] Patent Number: 6,109,929
[45] Date of Patent: Aug. 29, 2000

[54] HIGH SPEED STACKABLE MEMORY SYSTEM AND DEVICE

[75] Inventor: Jonathan C. Jasper, Campbell, Calif.

[73] Assignee: Agilent Technologies, Inc., Palo Alto, Calif.

[21] Appl. No.: 09/124,424

[22] Filed: Jul. 29, 1998

[51] Int. Cl.[7] .............................. H01R 12/00; H05K 1/00
[52] U.S. Cl. ............................................. 439/74; 361/790
[58] Field of Search ....................... 439/74, 75; 361/735, 361/790

[56] References Cited

U.S. PATENT DOCUMENTS

| | | | |
|---|---|---|---|
| 4,739,473 | 4/1988 | Ng et al. | 364/200 |
| 4,761,730 | 8/1988 | Ng et al. | 364/200 |
| 4,909,746 | 3/1990 | Scholz | 439/74 |
| 5,128,831 | 7/1992 | Fox, III et al. | 361/396 |
| 5,176,526 | 1/1993 | Hillbish et al. | 439/74 |
| 5,181,855 | 1/1993 | Mosquera et al. | 439/74 |
| 5,229,960 | 7/1993 | De Givry | 365/63 |
| 5,497,471 | 3/1996 | Gillett | 395/425 |
| 5,544,017 | 8/1996 | Beilin et al. | 361/790 |
| 5,583,749 | 12/1996 | Tredennick et al. | 361/790 |
| 5,636,997 | 6/1997 | Kuroda et al. | 439/74 |
| 5,652,462 | 7/1997 | Matsunaga et al. | 257/686 |
| 5,707,242 | 1/1998 | Mitra et al. | 439/74 |
| 5,742,097 | 4/1998 | Matsunaga et al. | 257/686 |
| 5,884,319 | 3/1999 | Hafner et al. | 439/74 |
| 5,963,464 | 10/1999 | Dell et al. | 365/52 |
| 6,049,467 | 4/2000 | Tamarkin et al. | 361/790 |

*Primary Examiner*—Neil Abrams
*Assistant Examiner*—Hae Moon Hyeon

[57] ABSTRACT

A stackable memory system for minimizing the stub lengths of the memory data bus and data skew. The invention provides a memory controller, a memory connector, a data bus, a first stackable memory module and a terminator plate. The data bus electrically connects the controller to the memory connector. The first stackable memory module is mechanically and electrically connected to the memory connector. The terminator plate is adapted to substantially reduce reflections to the data bus and is electrically connected to the data bus through the first stackable memory module. Additional, the memory system may be expanded by adding stackable memory modules substantially similar to the first stackable memory module to the stackable memory system between the first memory module and the terminator plate. Each stackable memory module may include memory chips each of which has trace lines connecting the memory chip to a module connector. Each of the trace lines is substantially equal in length and connects to a single side of the memory chip.

13 Claims, 6 Drawing Sheets

HIGH SPEED STACKABLE MEMORY SYSTEM AND DEVICE

BACKGROUND OF THE INVENTION

1. Field of the Invention

This disclosure relates to digital memory. More particularly, this disclosure provides a high speed stackable memory system and device.

2. Description of the Related Art

As computers and their central processing units ("CPUs") become capable of executing instructions more rapidly, this ability carries with it a need for increased memory size and speed, and also bus size. The need has given rise to much design effort directed toward optimizing current and future memory device designs to provide quick memory response. Commonly recognized current examples of memory devices include dynamic random access memories ("DRAMs"), read only memories ("ROMs"), and static random access memories ("SRAMs"), as well as mechanical and optical devices, such as CD-ROMs.

In performing a typical data read operation, a memory controller (usually the CPU or, in larger systems, a dedicated memory controller) sends a read command to a particular memory chip. This command is propagated to the chip along one or more lines of a command bus. When received by the particular chip, the command causes the chip to locate and direct an output from its internal memory array onto a data bus, as a return data signal intended for the memory controller. The output then propagates along the data bus, which may or may not travel the same route as the command bus. In the example just given, there are three sources of time delay, including the propagation time of a read command from the controller to the chip, the time required for the chip to power its internal registers and to channel the proper output onto the data bus, and the time required for propagation of the output back to the controller.

Similarly, in performing atypical data write operation, the memory controller sends a write command to a particular memory chip along with the data to be written. This command is propagated to the chip along one or more lines of a command bus, while the data is propagated to the chip along one or more lines of a data bus. When received by the particular chip, the command causes the chip to channel the data from the data bus to the specified location of its internal memory array. The data propagating along the data bus may or may not travel the same route as the command propagating along the command bus. In the example just given, there are three sources of time delay, including the propagation time of a write command from the controller to the chip, the time required for propagation of the data from the controller, and the time required for the chip to power its internal registers and to channel the data from the data bus.

Typically, design efforts have focused primarily on improving internal routing and processing of instructions within memory chips. These improvements provide more responsive memory devices by reducing the time delay for a memory chip to channel data between its memory array and the memory bus, and also by allowing a higher frequency or smaller period within which the memory chip can channel data to and from the data bus. Common techniques such as multiplexing or pipelining are used on the memory chips to sequence the channeling of multiple data items onto the data bus. Improvements in memory chips tends to increase the frequency at which the memory chip can channel these data to the memory bus, such that the period related to this frequency is usually smaller than the time delay from the memory array to the data bus, and in an increasing number of computer systems, this period is smaller than the propagation time of a single data item to or from the memory chip to the controller.

These design efforts however, do not address the primary causes of the limitation of the frequency at which data can be channeled onto the data bus. First, the capacitance on the data bus formed by the memory chips themselves and other "loads." Second, the length of the module trace portions, or "stubs," that form part of the data bus, and third, variation in the stub lengths. As a result, many systems are sending data over the data bus at rates far lower than the operating speeds of the CPUs.

Figure 1:
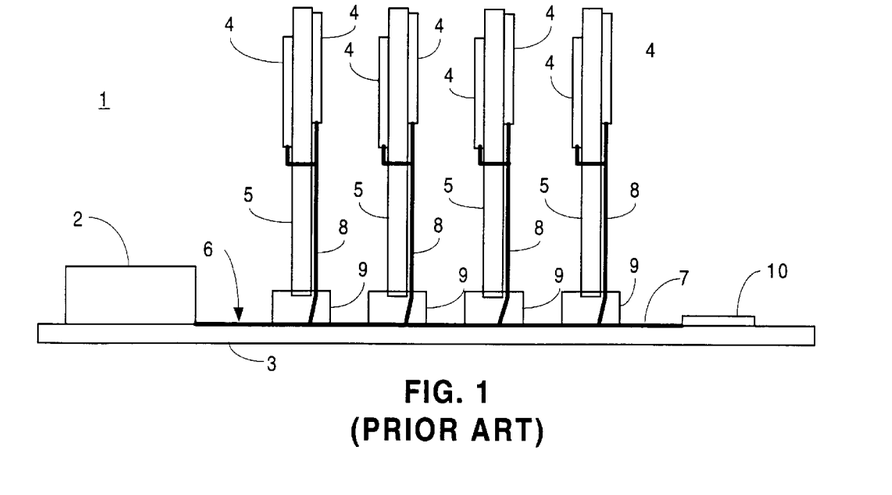
FIG. 1 is a side view of a prior art memory system.

The problem of load capacitance and stub length is further explained with reference to FIGS. 1 and 2. FIG. 1 illustrates a data path within a typical memory system 1. The data path includes a memory controller 2, a motherboard 3, memory chips 4, memory modules 5, and a data bus 6. The data bus 6 includes board trace portions 7, module trace portions 8, connectors 9, and termination 10. The memory controller is affixed to the motherboard and is electrically connected to the memory chips via the data bus. The memory chips are affixed to the memory modules. The board trace portion of the data bus is affixed to the motherboard and the module trace portion of the data bus is affixed to the memory modules. The board trace portion has a termination 10. The connectors 9 electrically connect the board trace portions to the module trace portions and mechanically affix the memory modules to the motherboard.

Figure 2:
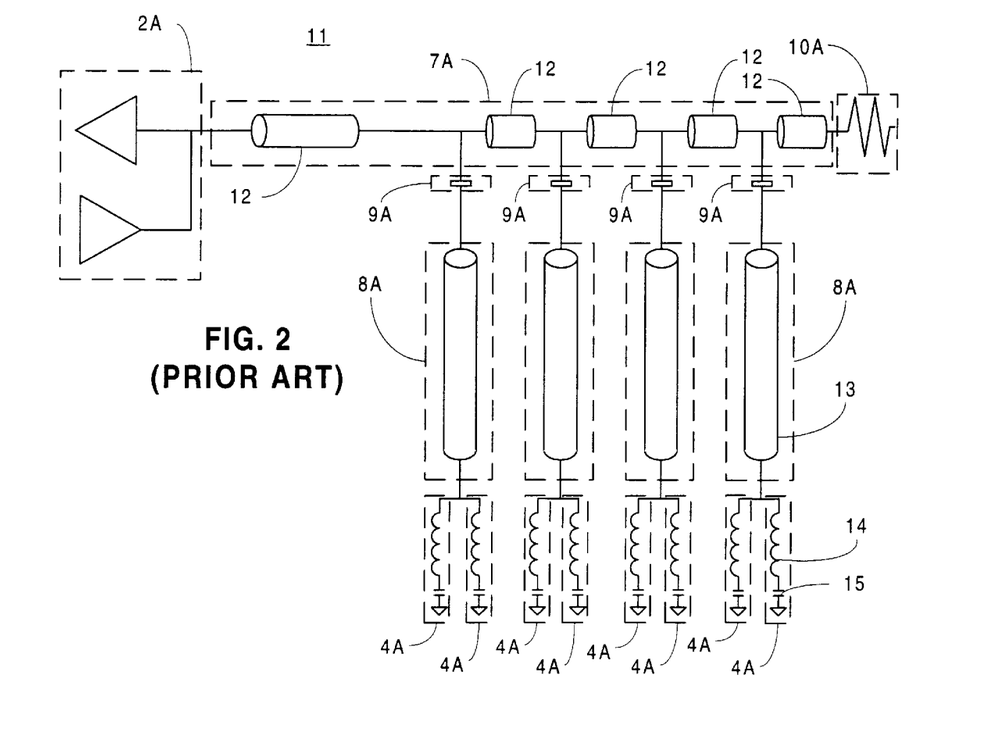
FIG. 2 is a schematic diagram illustrating the electrical equivalent of the prior art memory system of FIG. 1.

FIG. 2 depicts the electrical equivalent 11 of the typical data path shown in FIG. 1. For ease of reference, each electrical equivalent in FIG. 2 that represents a component shown in FIG. 1 is labeled with the reference numeral of the represented component with the suffix "A". It should be noted that the board trace portion 7A is made up of inductive and capacitive elements which together behave as a transmission line 12 having a set of impedance and transmission delay characteristics. Similarly, each of the module trace portions 8A are made up of inductive and capacitive elements which together behave as transmission line stubs 13, each having its own set of impedance and transmission delay characteristics.

Whenever a board trace such as 7A is broken into individual transmission lines by stubs and loads such as 8A and 4A, the maximum frequency at which data can be channeled on the board trace is reduced. This reduction in caused by interactions of electrical signals propagating along the subs and the board trace, and reflecting off of the stubs, the loads presented by the memory chips and memory controller, and the ends of the board trace. Above a certain frequency, data will not reliably propagate along the board trace. Adding a termination at the end of the board trace such as a termination resistor 10A, can minimize reflections from the end of the board trace, but the termination cannot completely compensate for the negative impact of the stubs and loads.

The frequency that data can be channeled onto the data bus is generally increased as load capacitance and stub lengths are reduced. The load capacitance, however, does not limit the frequency if there are no stubs. That is, if the stub lengths are reduced to zero such that the capacitive loads are connected directly to the board trace, the board trace tends to act like a simple transmission line without limiting the frequency. On the other hand, for data busses with stubs, the stubs will always act to limit the frequency even if the load capacitance is reduced to zero. Therefore, although it is desirable to minimize load capacitance in a system with stubs, reducing the stub length is of primary importance.

Figure 3A:
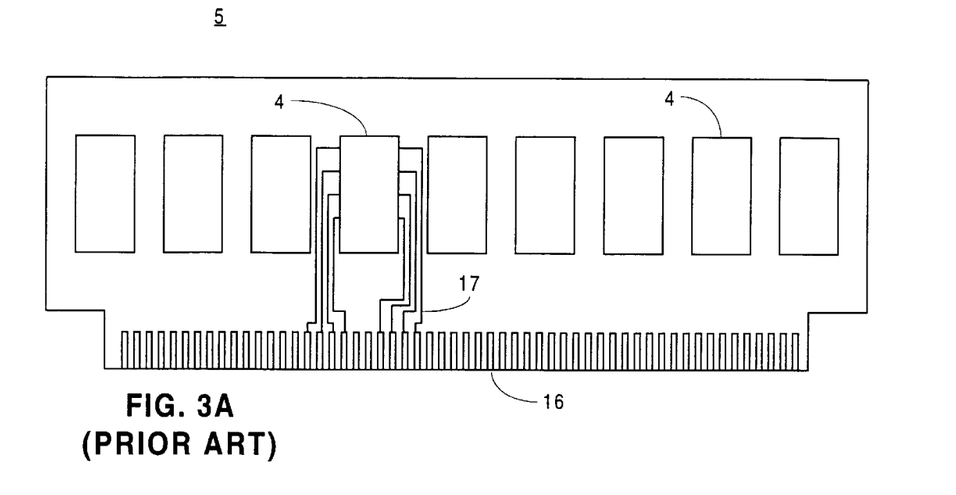
FIG. 3A is a plan view of a memory module having a first prior art configuration.
Figure 3B:
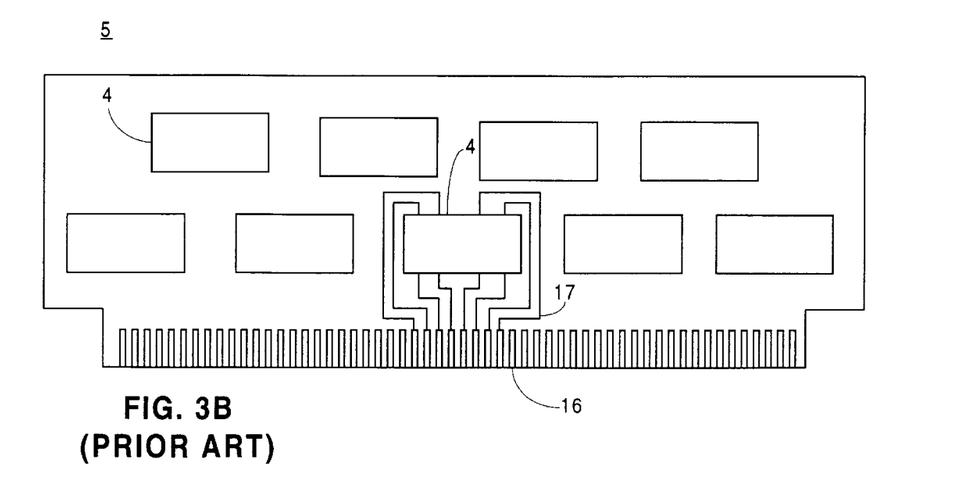
FIG. 3B is a plan view of a memory module having a second prior art configuration.

FIGS. 3A and 3B depict typical memory modules 5, according to the prior art. Each memory module typically has nine memory chips 4 on a side and a row of connector pins 16 along one edge for making electrical connections with the motherboard mounted connectors 9 (shown in FIG. 1). These memory chips 4 are typically either arranged in one of two fashions. The first is a straight row parallel to the row of connector pins 16 with a short edge of each memory chip facing the connector pins as shown in FIG. 3A. The second is two parallel rows of chips 4 each parallel to the row of connector pins with a long edge facing the row of connector pins 16 as depicted in FIG. 3B. Typically, the size of the standard module and the size of standard memory chips makes a single row of nine memory chip with the long edge facing the connector pins impracticable. A number of data and control trace lines 17 make the electrical connections from the connector pins 16 to the memory chips 4. While the figures show trace line for only one memory chip, it is understood that each of the memory chips would have a number of trace lines connecting it to the connector pins 16. Together, the trace lines 17 make up the board trace portion 8A of FIG. 2.

As can be seen in FIGS. 3A and 3B, the trace lines 17 typically vary in length since the limited space on the module 5 makes it impractical to make all the trace lines the same length. These unequal length trace lines 17 can cause problems in high speed memory systems. This is because data is typically sent simultaneously along multiple trace lines and the unequal length of the trace lines causes the signals to arrive at slightly different times. This is caused by the fact that data propagating along the longest trace lines takes longer to propagate than the data propagating along the shortest trace lines. As a result the memory controller is often required to wait to ensure the data on the longest trace line has arrived. This need to wait limits the overall speed of the memory system.

Together, the loads, stub lengths, and variation in stub lengths significantly slow the operating frequency of memory systems available today. Current memory systems attempt to solve these problems in several ways. One solution is to provide series resistors on the module trace portion of the data bus in order to electrically separate the module trace portion from the board trace portion of the bus. This technique has been successfully used for frequencies of up to 66 MHZ, but has not been very successful at higher frequencies. Another solution is to provide FET switches on the mother board that break the data bus into sections. For example, a switch multiplexor has been used to separate a set of four memory modules into two electrically independent groups of two modules. This approach creates two smaller memory busses, each presenting less inherent capacitance than the original larger bus. Each of these smaller busses however, still have inherent capacitance load on the data bus and thus have limited signal propagation speed.

In order to keep pace with CPU design and the tendency toward increased computer speed, there exists a need for higher frequency memory systems. In particular, there exists a need for a memory system that minimizes the length and variation of stubs on the data bus in order to allow reliable data propagation and to minimize skewing of the data and therefore allow higher frequency of operation.

SUMMARY OF THE INVENTION

The present invention provides a stackable memory system that allows short, equal length stubs. As a result it provides a high frequency memory system as will be required by computers of the future.

Briefly and in general terms, the invention provides a stackable digital memory system including a memory controller, a memory connector, a data bus, a first stackable memory module and a terminator plate. The data bus electrically connects the controller to the memory connector. The first stackable memory module is mechanically and electrically connected to the memory connector. The terminator plate is adapted to substantially reduce reflections along the data bus and is electrically connected to the data bus through the first stackable memory module.

The fist stackable memory module may also include a primary module connector directly connected to the memory connector, and an alternate module connector opposing the primary module connector and electrically connected to the primary module connector.

The terminator plate may additionally include a terminator connector substantially similar to the primary module connector of the first stackable memory module and capable of mating with the alternate module connector.

A second stackable memory module mechanically connected to the first stackable memory module and electrically connected to the data bus between the first stackable memory module and the terminator plate may also be provided. This second stackable memory module may be substantially similar to the first stackable memory module.

The invention additionally provides a stackable memory module including a substrate, a connector assembly, a first memory chip, a second memory chip, first trace lines, and second trace lines. The substrate has a first major surface and a second major surface. The connector assembly includes a primary module connector, an alternate module connector, and an electrical interconnect that electrically connects the primary module connector to the alternate module connector. The primary module connector extends from the first major surface and the alternate module connector extends from the second major surface. The alternate module connector is adapted to be mated with a third connector substantially similar to the primary module connector. The first memory chip located on the first major surface and the second memory chip is located on either the first major surface or the second major surface of the substrate. The first trace lines electrically connect the first memory chip to the connector assembly. The second trace lines electrically connect the second memory chip to the connector assembly. The first and second trace lines may coincide along part of their length.

The primary module connector may additionally substantially divide the first major surface into a first portion and a second portion while the alternate module connector may substantially divide the second major surface into a third portion and a fourth portion. In this case, the first memory chip may be located on the first portion and the second memory chip may be located on the second portion.

A third memory chip located on the second major surface in the third portion and a fourth memory chip located on the second major surface in the fourth portion may also be provided. In such a case, third trace lines electrically connect the third memory chip to the connector assembly and fourth trace lines electrically connect the fourth memory chip to the connector assembly.

Each of the first trace lines may be substantially the same length. Similarly, each of the second trace lines may be substantially the same length as each of the first trace lines. The first trace lines may attach to the first memory chip along a single edge of the first memory chip. The first memory chip may be substantially rectangular in shape and oriented such that the single edge is substantially parallel to the primary module connector.

Additional memory chips having a substantially rectangular shape may also be provided. If provided, the additional memory chips may be located on the first portion at substantially the same distance from the primary module connector as the first memory chip, and may be electrically connected to the primary module connector.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

As shown in the drawings for purposes of illustration, the invention provides a stackable memory system and a stackable memory module. The invention is based upon the concept that a stackable memory configuration reduces the stub length on a memory data bus by allowing all memory chips to be located at a minimal distance from the data bus and further allowing all trace lines on the module to be of substantially equal length. The configuration increases the overall speed at which data can be channeled onto the data bus by increasing the frequency at which data will reliably propagate on the data bus between the memory controller to memory chips, and vice versa. In effect, this configuration allows each of the data lines that make up the data bus to change states, for example from a voltage representing a logical ONE to a voltage representing a logical ZERO, more quickly. Further, data skew is minimized, thus minimizing the amount of time the memory controller is in a "wait state" and increasing the overall speed at which the memory system can operate.

The invention provides the faster memory operations demanded by the ever increasing speed of central processing units (CPUs) in computers today. By allowing data to be channeled onto the data bus at higher frequencies, advances in CPU speed and memory chip speed can be taken advantage of more effectively.

Figure 4A:
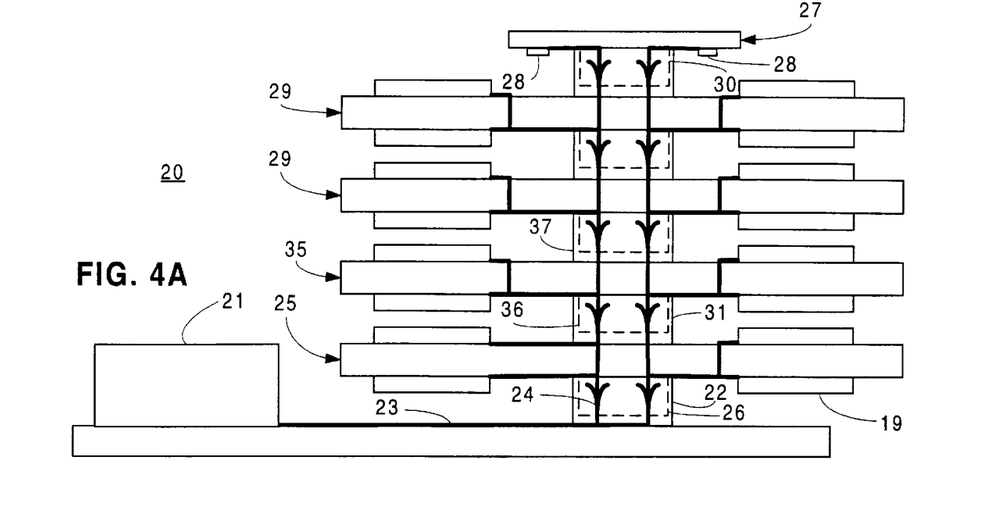
FIG. 4A is a side view of a stackable memory system according to the invention.
Figure 4B:
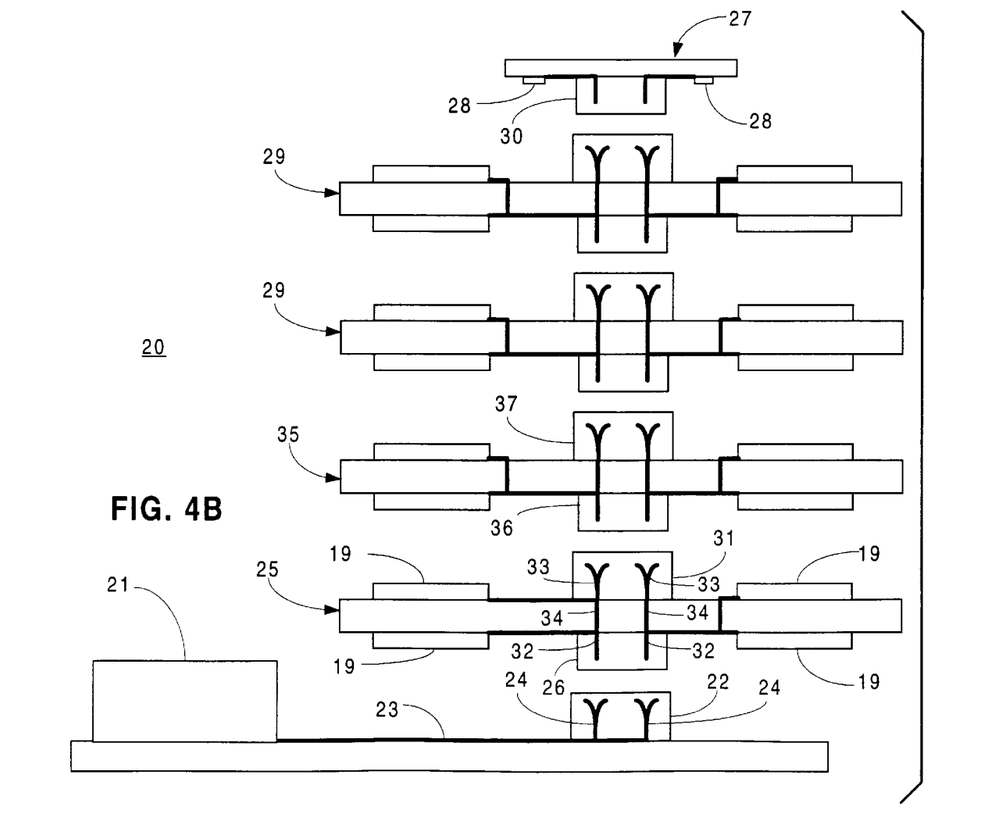
FIG. 4B is an exploded view showing the components making up the stackable memory system of FIG. 4A.

Referring now to the drawings, it is noted that identical reference numerals are used to designate identical or similar elements throughout the several views, and that elements are not necessarily shown to scale. FIGS. 4A and 4B depict a stackable memory system 20 according to a preferred embodiment of the invention 20. The stackable memory system includes a memory controller 21, which may be either a CPU or a dedicated memory controller, electrically connected to a memory connector 22 by a data bus 23. While the data bus is depicted as a single connection in the figures, it is understood that a data bus often includes numerous data lines running in parallel. It is not uncommon to see data busses that include eight, sixteen, thirty-two, sixty-four, seventy two, or more individual parallel data lines. Similarly, while the figures depict only two memory connector terminals 24 in the memory connector 22, memory connectors will typically have at least as many terminals as there are data lines since the same connector may be used for data connections and power connections.

The stackable memory system according to the invention also includes a stackable memory module 25. The stackable memory module includes at least one memory device 19 that may include read only memory (ROM) or random access memory (RAM), and is preferably dynamic random access memory (DRAM). The stackable memory module 25 is mechanically and electrically connected to the memory connector 22. The mechanical and electrical connections are typically formed by mating a primary connector 26 located on the stackable memory module 25 to the memory connector 22. This provides electrical contact between the memory controller 21 and the stackable memory module 25.

The memory system according to the invention additionally may include a terminator plate 27 adapted to substantially reduce reflections from the end of the data bus 23. In order to reduce reflections, the terminator plate includes electrical components 28 selected to compliment and match the electrical characteristics of the data bus 23, or more precisely, each of the data lines that make up the data bus. The method of selecting these electrical components is known in the art, and the electrical components may include active components, passive components, or combinations thereof. Typically the electrical components will include resistors. When the proper electrical components are selected, the data bus will act more like a simple transmission line and the frequency limitation caused by the stubs and loads will be moderated.

The terminator plate 27 is electrically connected to the data bus through the stackable memory module 25. Thus, the terminator plate may be directly connected to the stackable memory module 25 (configuration not shown) or other items, such as additional memory modules 29, may be interposed between the memory module 25 and the terminator plate 27. In order to allow the terminator plate 27 to be directly connected to the stackable memory module 25, it is desirable that the terminator plate include a terminator connector 30 and the stackable memory module 25 include an alternate module connector 31 capable of mating with the terminator connector. The alternate module is electrically connected to the primary module connector and may be opposed to the primary module connector such that the stackable memory module 25 may be easily connected to both the terminator plate 27 and the memory connector 22 in a stacked configuration.

One benefit of this stacked configuration is that the portion of the stackable memory module 25 in the direct electrical path between the terminator plate and the data bus will also behave like a simple transmission line. The portions of the stackable memory module most benefitted are the primary module connector terminals 32, the alternate module connector terminals 33, and any electrical interconnections 34 between the primary module connector terminals and the alternate module connector terminals.

The stackable memory system according to the invention may also include a second stackable memory module 35. For clarity, hereinafter the previously mentioned stackable memory module 25, primary module connector 26, and alternate module connector 31 will be preceded by the term "first." The second stackable memory module is mechanically connected to the first stackable memory module and electrically connected to the data bus 23 between the first stackable memory module 25 and the terminator plate 27. The second stackable memory module preferably also includes a second primary module connector 36 adapted to mate with the first alternate module connector 31. Thus, a mechanical and electrical connection between the second stackable memory module and the first stackable memory module may be accomplished by mating the second primary module connector 36 and the first alternate module connector 31.

The interconnection between the second primary module connector and the first alternate module connector also may provide part of the electrical path between the data bus 23 and the second stackable memory module. Specifically, the electrical path between the second stackable memory module and the data bus would include the first alternate module connector terminals 33, electrical interconnections 34, first primary module connector terminals 32, and memory connector terminals 24. It is preferable that the second primary module connector 36 be substantially similar to both the terminator connector 30 and the first primary module connector 26 in order to provide the greatest versatility and interchangeability in the stackable memory system 20.

The second stackable memory module 35 also preferably includes a second alternate module connector 37. The second alternate module connector is electrically connected to the second primary module connector 36 and preferably faces in an opposing direction. The second alternate module connector may be used either to directly connect the terminator plate 27 (connection not shown) or to directly connect additional memory modules 29. It is preferable that the second alternate module connector be substantially similar to the first alternate module connector 31 in order to provide the greatest versatility and interchangeability in the memory system.

Additionally, it may be desirable in some stackable memory systems 20 that the second memory module 35 and any additional memory modules 29 be substantially similar to the first memory module 25. This promotes standardization or tends to decrease the overall cost of each memory module 25, 35, 29.10.

Figure 5:
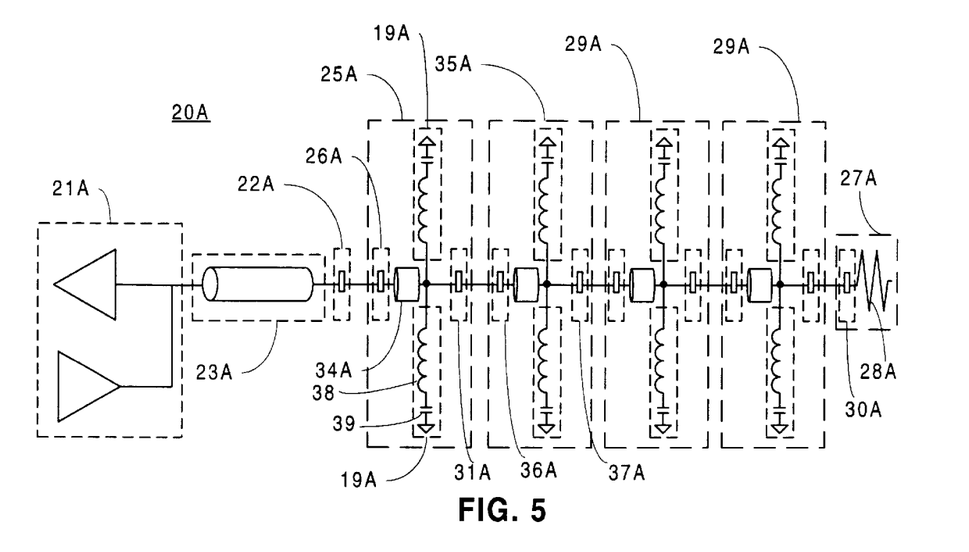
FIG. 5 is a schematic diagram illustrating the electrical equivalent of the stackable memory system of FIG. 4.

In order to further describe the stackable memory FIG. 5 depicts a schematic diagram of the memory system of FIGS. 4A and 4B. For clarity, the electrical equivalents of items shown in FIG. 5 are marked with the same reference numerals as the items in FIGS. 4A and 4B with an added "A" suffix. Also for clarity, the data bus is depicted as a single data line. Despite this simplification, FIG. 5 illustrates that the data bus 23A and electrical interconnects 34A are electrically equivalent to nearly perfect transmission lines.

In addition each memory device 19A has an associated inductive element 38 and a capacitive element 39. Together these elements create a memory device capacitive load in the memory system 20A. The overall capacitive loading of the data bus must be minimized in order to maximize the speed of the memory system. As will be discussed in detail below, the memory system according to the invention minimizes these loads my keeping connections 40 between the memory devices 19A and the electrical interconnects 34A as short and equidistant as possible in order to minimize the "comb filter" effect.

Figure 6:
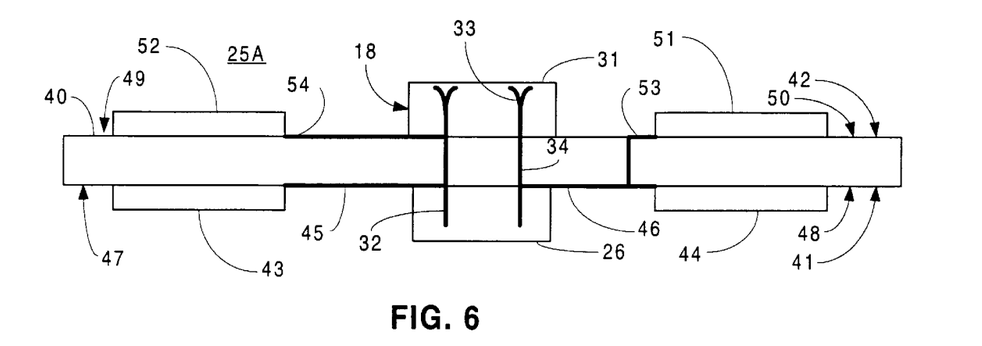
FIG. 6 is a side view of a stackable memory module according to the invention.
Figure 7:
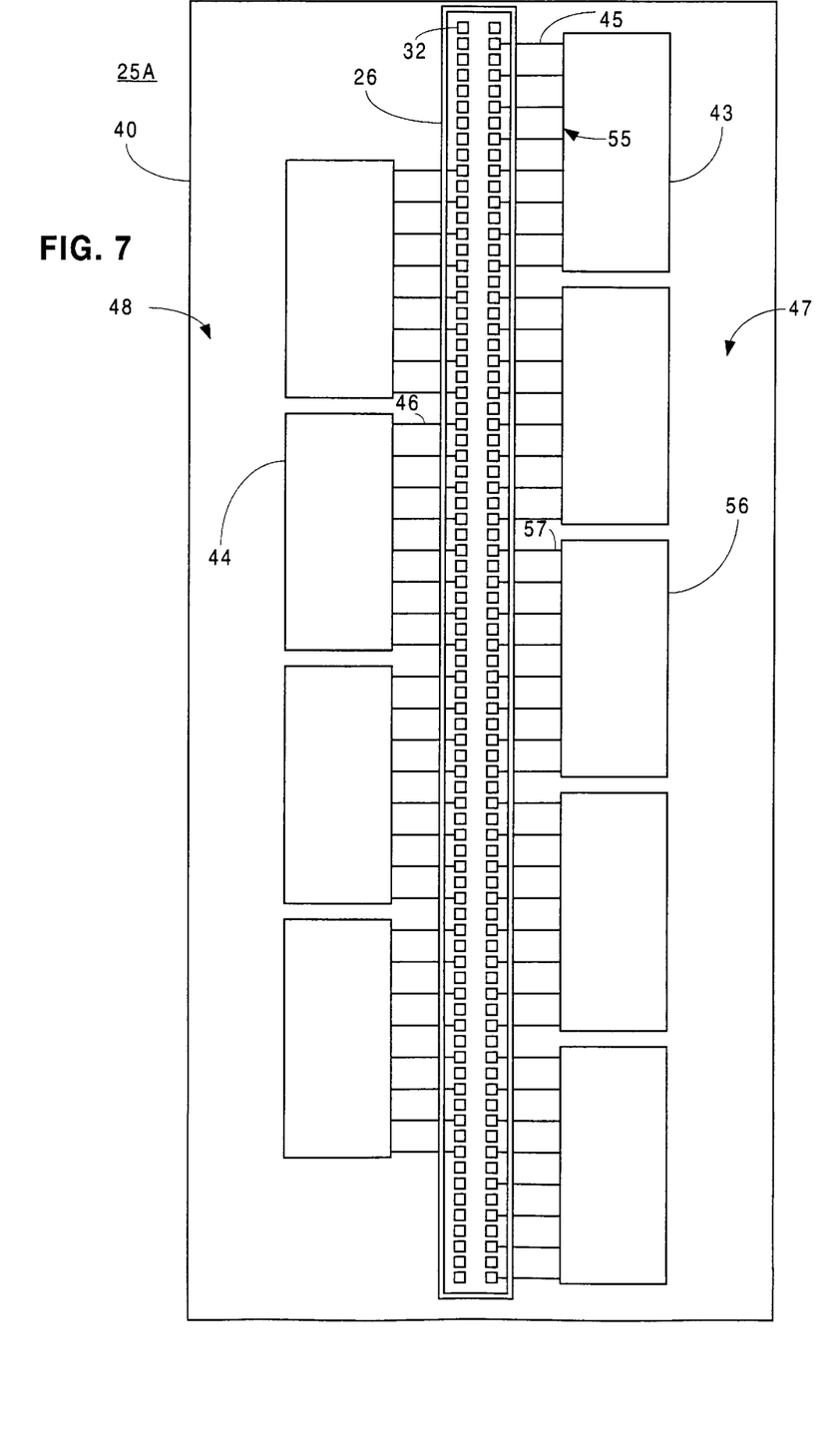
FIG. 7 is a top view of the stackable memory module of FIG. 6.
Figure 8:
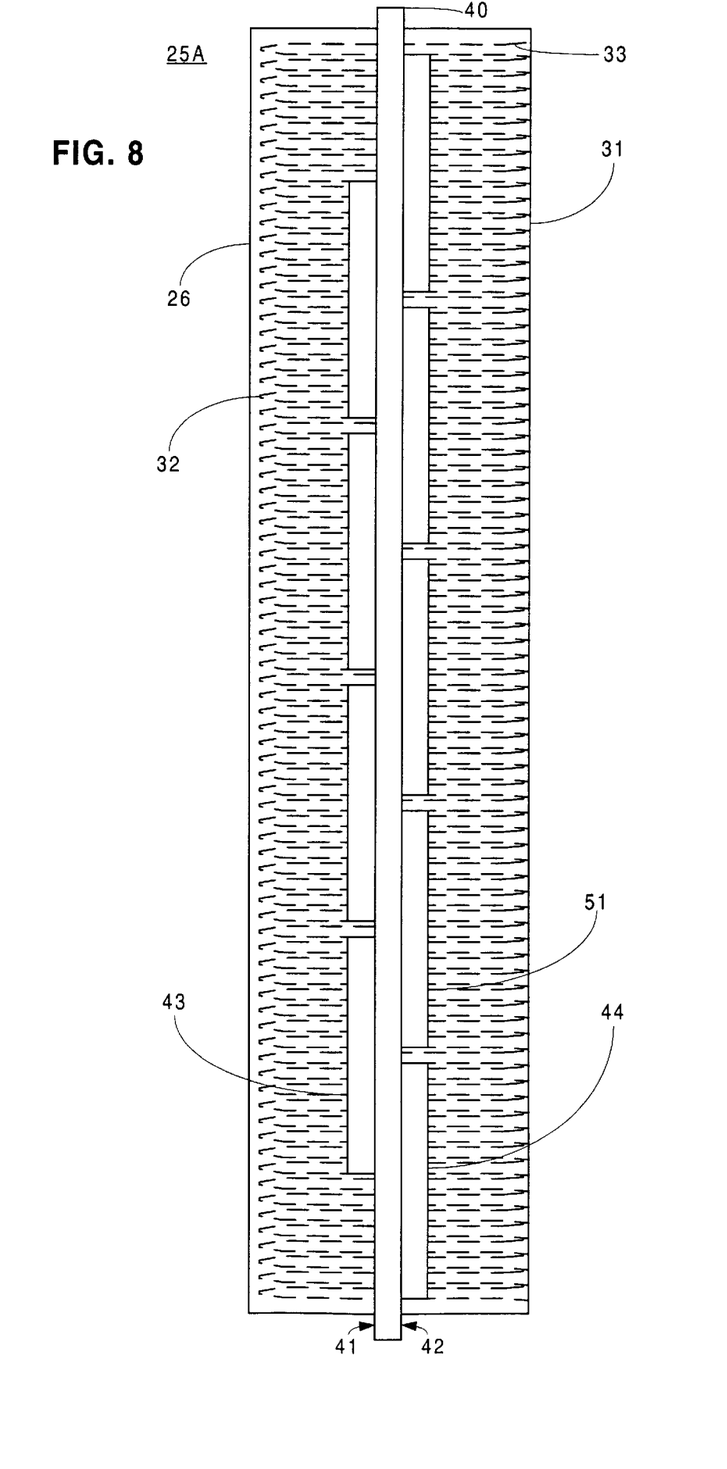
FIG. 8 is a front view of the stackable memory module of FIG. 6.

A stackable memory module, substantially similar to the first stackable memory module 25 described above, will now be described in detail. FIGS. 6, 7, and 8 depict the stackable memory module 25 from a side, top and front views, respectively. The stackable memory module includes a substrate 40 having a first major surface 41 and a second major surface 42. The selection of substrates for memory modules is known in the art.

The stackable memory module 25 additionally includes a connector assembly 18. The connector assembly includes a primary module connector 26, an alternate module connector 31, and an electrical interconnection 34 that electrically connects the primary module connector 26 and the alternate module connector 31. The primary module connector extends from the first major surface 41. Selection of connectors for memory applications is known in the art. The number of connection terminals will be dependent on the number of data, control, and power connections needed. While the figures depict a primary module connector 26 using two rows of "male" primary module connector terminals 32, many different types and configurations of connectors may suffice.

The alternate module connector 31 extends from the second major surface 42 and is adapted to be mated with a third connector (not shown) substantially similar to the primary module connector 26. While the figures depict a connector using two rows of "female" socket type of alternate module connector terminals 33, many different types of configurations of connectors may suffice. The primary module connector 26 and the alternate module connector 31 should be of types that can repeatedly provide a good mechanical and electrical connection when mated.

The stackable memory module 25 according to the invention additionally includes a first memory chip 43 located on the first major surface 41. The memory chip is of a type substantially similar to the memory device 19 described previously although it may include some special features that will be discussed in detail below. The stackable memory module 25 according to the invention also includes a second memory chip 44 located on either the first major surface 41, as shown in FIGS. 6 and 7, or on the second major surface 42 of the substrate 40, as shown in FIG. 8.

The first memory chip 43 is electrically connected to the connector assembly 18 by first trace lines 45. Enough trace lines connect the first memory chip to the connector assembly to enable data, control, and power functions in the memory chip. The second memory chip 44 is similarly connected by second trace lines 46 to the connector assembly 18.

As shown in the figures, the primary module connector 26 may substantially divide the first major surface 41 into a first portion 47 and a second portion 48. Similarly, the alternate module connector 31 may substantially divide the second major surface 42 into a third portion 49 and a fourth portion 50. It is also desirable the first portion 47 and second portion 48 be substantially similar in area. Likewise the third portion 49 and fourth portion 50 may be substantially similar in area.

When the first major surface 41 of the substrate 40 has been divided, the first memory chip 43 may be located on the first portion 47 and the second memory chip 44 may be located on the second portion 48.

The stackable memory module 25 according to the invention may also include a third memory chip 51 on the second major surface 42 in the third portion 49 and a fourth memory chip 52 located on the second major surface 42 in the fourth portion 50. If this is the case, then the third memory chip 51 is connected to the connector assembly 18 by third trace lines 53 and the fourth memory chip 52 is connected to the connector assembly by fourth trace lines 54.

It is understood however, that not all the trace lines must travel along one of the major surfaces 41, 42 to the connector assembly 18. In some instances it may be desirable for a trace line to pass completely or partially through the substrate 40 as shown by third trace line 53 in FIG. 6. In such an instance, it is possible for the trace line passing through the substrate to coincide with part of another trace line. For example, in FIG. 6, the third trace line 53 may coincide with part of the second trace line 46. In this way, instead of two separate stubs, shown by the first and fourth trace lines 45, 54 on the left hand side of FIG. 6, a single "Y" shaped stub, represented by the second and third trace lines 46, 53 on the right hand side of FIG. 6, may suffice.

As described above, it is desirable that all the trace lines 45, 46, 53, 54 connecting memory chips 43, 44, 51, 52 to the module connectors 26, 31 be of substantially the same length and as short as possible in order to minimize the "comb effect" that can limit the frequency at which data can reliably propagate on the memory bus. In addition, equal length trace lines minimize problems associated with data skew created when data takes longer to propagate along long trace lines than it does down short trace lines. Thus, it is desirable that each of the first trace lines 45 are substantially the same length. Similarly each of the second trace lines 46 should be made of equal length. The third trace lines 53 should all be of the same length and the fourth trace lines should all be of the same length. It is also desirable that all of the first, second, third and fourth trace lines be of equal length.

To accomplish this all of the trace lines, or at least those trace lines used for high speed data (as opposed to the power connections), connecting a memory chip to the connector assembly 18 should attach to the memory chip along a single edge. This is most clearly seen in FIG. 7. For example, each of the first trace lines 45 attaches to the first memory chip 43 along a single edge 55 of the first memory chip. It will be apparent that the same can be done for the second, third, and fourth memory chips with their respective trace lines. This scheme works best when the memory chips are substantially rectangular in shape and are oriented such that the single edge 55 is substantially parallel to the module connector that the trace lines attach to. The single edge will typically be the long side of the rectangle as it must accommodate the trace line connections.

It is understood that it is still often desirable to have nine memory chips on each major surface of the memory module. This can easily be accommodated on the stackable memory module 25. Additional memory chips 56 may be aligned in a row substantially parallel to the module connector with all the electrical connections going to the module connector having substantially the same length as shown in FIG. 7. Thus, for example, additional memory chips 56, each of which may be substantially rectangular in shape, may be located on the first portion 47. The additional memory chips may be located at substantially the same distance from the primary module connector 26 as the first memory chip 43. Each of the additional memory chips would then be electrically connected to the primary module connector with additional trace lines 57, each of which is substantially the same length as the first trace lines 45.

Having thus described a exemplary embodiments of the invention, it will be apparent that further alterations, modifications, and improvements will also occur to those skilled in the art. Such alterations, modifications, and improvements, though not expressly described or mentioned above, are nonetheless intended and implied to be within the scope of the invention. Accordingly, the foregoing discussion is intended to be illustrative only; the invention is limited and defined only by the various following claims and equivalents thereto.

What is claimed is:

1. A stackable memory module with reduced stub length, comprising:
    a substrate having a first major surface and a second major surface;
    a connector assembly including:
        a primary module connector extending from the first major surface,
        an alternate module connector extending from the second major surface, the alternate module connector adapted to be mated with a third connector substantially similar to the primary module connector, and
        an electrical interconnection that electrically connects the primary module connector to the alternate module connector;
    a plurality of memory chips located at a substantially equal distance from the connector assembly, the plurality of memory chips including:
        a first memory chip, and
        a second memory chip;
    first trace lines electrically connecting the first memory chip to the connector assembly; and
    second trace lines electrically connecting the second memory chip to the connector assembly.

2. The stackable memory module of claim 1, in which:
    the primary module connector substantially divides the first major surface into a first portion and a second portion; and
    the alternate module connector substantially divides the second major surface into a third portion and a fourth portion.

3. The stackable memory module of claim 2, in which:
    the first memory chip is located on the first portion; and
    the second memory chip is located on the second portion.

4. The stackable memory module of claim 3, in which the plurality of memory chips additionally includes:
    a third memory chip located on the second major surface in the third portion, and
    a fourth memory chip located on the second major surface in the fourth portion; and additionally comprising:
    third trace lines electrically connecting the third memory chip to the connector assembly; and
    fourth trace lines electrically connecting the fourth memory chip to the connector assembly.

5. The stackable memory module of claim 1, in which each of the first trace lines are substantially the same length.

6. The stackable memory module of claim 5, in which each of the second trace lines are substantially of the same length as each of the first trace lines.

7. The stackable memory module of claim 5, in which each of the first trace lines attaches to the first memory chip along a single edge of the first memory chip.

8. The stackable memory module of claim 7, in which the first memory chip is substantially rectangular in shape and is oriented such that the single edge is substantially parallel to the primary module connector.

9. The stackable memory module of claim 1 wherein the primary module connector substantially bisects the first major surface.

10. A stackable memory module with reduced stub lengh, comprising:

a substrate having a first major surface and a second major surface;

a connector assembly including:

a primary module connector extending from the first major surface, an alternate module connector extending from the second major surface, the alternate module connector adapted to be mated with a third connector substantially similar to the primary module connector, and         an electrical interconnection that electrically connects the primary module connector to the alternate module connector;

a plurality of memory chips, each of the memory chips located at a substantially equal distance from the connector assembly; and     a plurality of sets of trace lines, each set of trace lines being of substantially equal length and electrically connecting a corresponding memory chip from the plurality of memory chips to the connector assembly.

11. The stackable memory module of claim 10, in which each trace line in each set of trace lines is substantially equal in length.

12. The stackable memory module of claim 10, in which each set of trace lines connects to the corresponding memory chip of the plurality of memory chips along a single edge of the corresponding memory chip.

13. The stackable memory module of claim 12, in which each of the plurality of memory chips is substantially rectangular in shape and is oriented such that the single edge is substantially parallel to the primary module connector.

* * * * *